United States Patent [19]

Moore

[11] 4,021,375
[45] May 3, 1977

[54] METHOD OF FABRICATING POLYCRYSTALLINE SELENIUM IMAGING DEVICES

[75] Inventor: Robert Milton Moore, Carmel, Ind.

[73] Assignee: RCA Corporation, New York, N.Y.

[22] Filed: Sept. 15, 1975

[21] Appl. No.: 613,358

[52] U.S. Cl. .................. 252/501; 96/1.5; 313/386; 427/74; 427/76; 252/512; 252/518

[51] Int. Cl.² ........................ H01L 31/00

[58] Field of Search ........... 252/501, 512, 518; 313/386; 427/76, 74; 96/1.5

[56] References Cited

UNITED STATES PATENTS

| | | | |
|---|---|---|---|
| 2,833,675 | 5/1958 | Weimer | 427/74 |
| 2,887,411 | 5/1959 | Hoppe et al. | 427/248 X |
| 3,020,442 | 2/1962 | Nicholson et al. | 52/501 X |
| 3,310,700 | 3/1967 | Dresner et al. | 252/501 |
| 3,350,595 | 10/1967 | Kramer | 252/501 |
| 3,901,703 | 8/1975 | Baum | 96/1.5 |

Primary Examiner—Benjamin R. Padgett
Assistant Examiner—E. Suzanne Parr
Attorney, Agent, or Firm—Glenn H. Bruestle; Dennis H. Irlbeck

[57] ABSTRACT

A photoconductive target for a vidicon-type camera tube, which includes a layer of polycrystalline selenium, is exposed to a diffusion cycle wherein the temperature is gradually increased from an initial baking temperature of about 50° C. to a final baking temperature of about 150° C. at a rate of about 5° C. per minute. Thereafter the target is baked at a temperature of about 100° C. for about 16 hours in oxygen to substantially reduce the dark current of the target.

7 Claims, 3 Drawing Figures

METHOD OF FABRICATING POLYCRYSTALLINE SELENIUM IMAGING DEVICES

BACKGROUND OF THE INVENTION

In the manufacture of imaging devices such as vidicons which have photoconductive bodies including polycrystalline selenium layers certain "mottling" defects often occur involving a nonhomogeneous physical structure of the body. These mottling defects produce undesired perceptible variations in the color or appearance of the detected or observed image during operation of such devices. Such bodies also often display undesirably high dark current characteristics.

DETAILED DESCRIPTION

Figure 1:
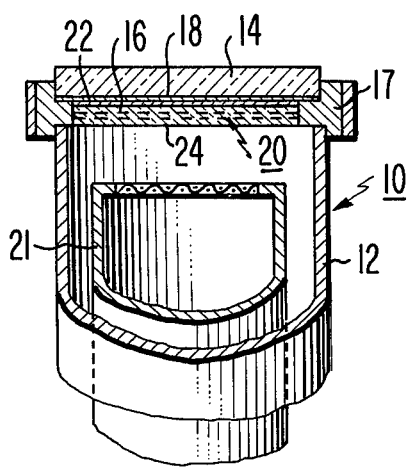
FIG. 1 is a greatly exaggerated partial cross-sectional view of a vidicon fabricated in accordance with the invention.

Referring to FIG. 1, a vidicon-type camera tube 10 is partially shown. The tube 10 is constructed in a manner well known in the art and includes a tubular glass bulb 12 having an open end portion across which a glass faceplate 14 is hermetically sealed by an indium ring 17. A target 16 extends across an inner major surface 18 of the faceplate 14. The target 16 comprises a photoconductive body 20 and a transparent conductive coating 22 between the inner major surface 18 of the faceplate 14 and the body 20. The coating 22 provides an electrode means for applying an electrical potential to the facing surface of the body 20. The coating may consist of any transparent conductive material which is an n-type semiconductor, such as tin oxide or a metal having a low work function less than about 5.0 eV., such as aluminum.

Tube 10 includes an electron beam forming and scanning means 21 (partially shown in FIG. 1) for scanning an electron beam within an evacuated central cavity of the bulb 12 to impinge upon the available or exposed major surface 24 of the body 20 in raster fashion.

Figure 2:
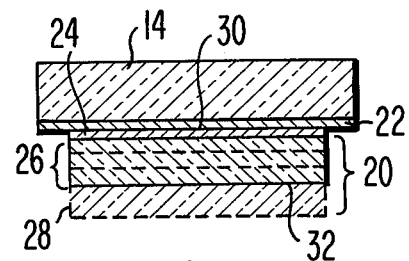
FIG. 2 is a greatly exaggerated cross-sectional view of the end portion of the tube depicted in FIG. 1.

Referring to FIG. 2, an exaggerated view of the faceplate 14, coating 22, and two possible embodiments of the photoconductive body 20 is shown. The photoconductive body 20 comprises in a direction extending from the coating 22; a thin tellurium film or layer 24; a layer of panchromatic polycrystalline hexagonal (trigonal) selenium 26 and an optional layer 28 of tellurium dioxide, $TeO_2$.

In a preferred method, the body 20 is fabricated along the available surface of a transparent tin oxide conductive coating 22 which has been predeposited along the major surface 18 of a glass faceplate or substrate in a manner well known in the art. The photoconductive body 20 may be fabricated as follows:

INITIAL DEPOSITION

A workpiece including the coating 22 along the major surface 18 of glass substrate 14 is initially placed in a chamber which is thereafter evacuated to a pressure level of less than $10^{-4}$ torr. Pressure levels of less than about $10^{-5}$ torr, however, are preferred. A thin layer of tellurium 24 of from about 15A to about 60A thick is thereafter vapor deposited along the available surface 30 of coating 22. The tellurium layer is preferably about 30A in thickness. Thereafter, a thin layer of thallium or thallium containing material such as thallium-selenium compounds ($Tl_2Se_3$ or $Tl_2Se$) from about 20A to about 120A in thickness is vapor deposited along the tellurium layer. Preferably the thallium or thallium containing layer is about 30A in thickness. A layer of amorphous or vitreous selenium is thereafter vapor deposited along the available surface of the layer of thallium or thallium containing material to a thickness of from about $2 \mu m$ to about $8 \mu m$. The amorphous selenium layer preferably is about $4 \mu m$ in thickness. The workpiece processed is approximately at ambient room temperature (i.e. unheated).

CRYSTALLIZATION

After the initial deposition cycle, the workpiece is baked at a temperature of from about 150° C. to about 190° C. in an atmosphere of air, oxygen, or oxygen and water vapor for a period of time from about 15 to about 60 minutes to substantially convert the selenium layer to the polycrystalline hexagonal (trigonal) form of selenium, as evidenced by the formation of a characteristic gray opaque crystalline layer. A crystallization temperature at about 180° C. is preferred.

SECOND DEPOSITION

As a third step, which is optional, a thin layer of thallium or thallium containing material such as thallium selenide from about 15A to about 500A thick is vapor deposited along the crystallized selenium layer of the workpiece resulting from the previous step. This layer of thallium or thallium containing material is preferably about 30A and is vapor deposited along the workpiece after it has been cooled to ambient temperature.

DIFFUSION

The workpiece resulting from the previous step is subjected to a baking cycle in an atmosphere comprising air or oxygen for an effective period of time to cause the substantially complete diffusion of thallium from the abutting thallium or thallium containing layer(s) (the interfacing surfaces of which are shown as dashed lines in FIG. 2), into the crystalline selenium layer. The diffusion atmosphere may include water vapor.

A time-temperature diffusion sequence is selected for this step which optimizes the quality of the photoconductive body 20 by minimizing the aforementioned surface "mottling". In this regard, a sequence or series of incremental diffusion baking steps has been found particularly beneficial, wherein the preliminary or initial temperature bake of the workpiece is at a temperature of less than about 60° C. for period of time greater than about 15 minutes. An initial or preliminary temperature bake at about 50° C. is preferred. A series of one or more intermediate baking periods may thereafter be achieved between that preliminary temperature and a desired final diffusion temperature for similar periods of time. Alternatively, the intermediate diffusion baking steps may comprise a gradual continuous increasing of the diffusion baking temperature at a rate, for example of about 5° C. per minute until a final or ultimate temperature between about 140° C. and 180° C. is achieved. A final baking of the workpiece at that final temperature is thereafter accomplished for a period of time in excess of about 15 minutes. A final baking temperature of about 150° C. is preferred. The gradual increasing of the diffusion baking temperature, from an initial or preliminary value less than about 60° C., to the final temperature has been found to be particularly helpful in reducing the surface mottling noted.

While the thallium dopant level of the selenium layer 26, accomplished by the above described diffusion operation, is preferably on the order of 1000 parts-per-million-atomic (ppma), dopant levels of from about 100 to about 10,000 ppma may be employed to advantage.

OPTIONAL DIFFUSION/ANNEAL AND POST DEPOSITION

While the aforementioned steps may be employed for fabricating useable photoconductive bodies, preferred embodiments of the photoconductive body have been found to result from the following additional steps:

After the completion of the foregoing steps, the photoconductive body should be subjected to diffusion/anneal baking at a temperature of from about 80°–120° C. in an atmosphere of air, oxygen, or oxygen and water vapor for a period of time necessary for decreasing the dark current associated with the body by a factor of two or three, and also for improving the cosmetic quality of that body, thereby also improving the quality of the detected image. Preferably this baking step is of a temperature of about 100° C. for a period of time of about 16 hours in an oxygen atmosphere.

A layer 28 of tellurium dioxide, $TeO_2$, is also preferably thereafter vapor deposited along the available major surface 32 of the body 20. The addition of tellurium dioxide is effective for reducing signal buildup and lag associated with the operation of the body 20 within a vidicon target. The tellurium dioxide layer 28 preferably is about 25A thick; however, thickness of from about 10A to about 125A may be employed to advantage.

Photoconductive bodies fabricated in the previously described manner have been found to produce highly sensitive vidicon targets having dark currents as low as $10nA/cm^2$ at voltages approaching 30 volts. In general, photoconductive bodies of this type may be fabricated along n-type semiconductors such as, for example, tin oxide transparent coatings, or low work function metal materials such as aluminum to provide a "blocking contact" at the planar interface region between coating 22 and the body 20.

The blocking contact as herein defined comprises a rectifying junction whereby non-photogenerated holes are substantially "blocked" or prevented from entering or being conducted into the P-type selenium layer from a suitable positive source of electric potential (connected to the ring 17 and coating 22 during operation of the tube 10) and whereby photogenerated minority carriers (electrons) within the P-type selenium layer may be effectively conducted through that junction to combine with such holes as are accumulated along the coating 22. The blocking contact fabricated is described more fully in the copending application entitled "Selenium Rectifier Having Hexagonal Polycrystalline Selenium Layer" filed jointly with C. Busanovich and simultaneously herewith, and herein incorporated by reference.

The operation and performance of various photoconductive imaging devices, such as, for example, the vidicon-type camera tube 10 herein described, is disclosed in the simultaneously filed copending application entitled "Polycrystalline Selenium Imaging Devices" jointly filed with C. Busanovich and is herein incorporated by reference.

Figure 3:
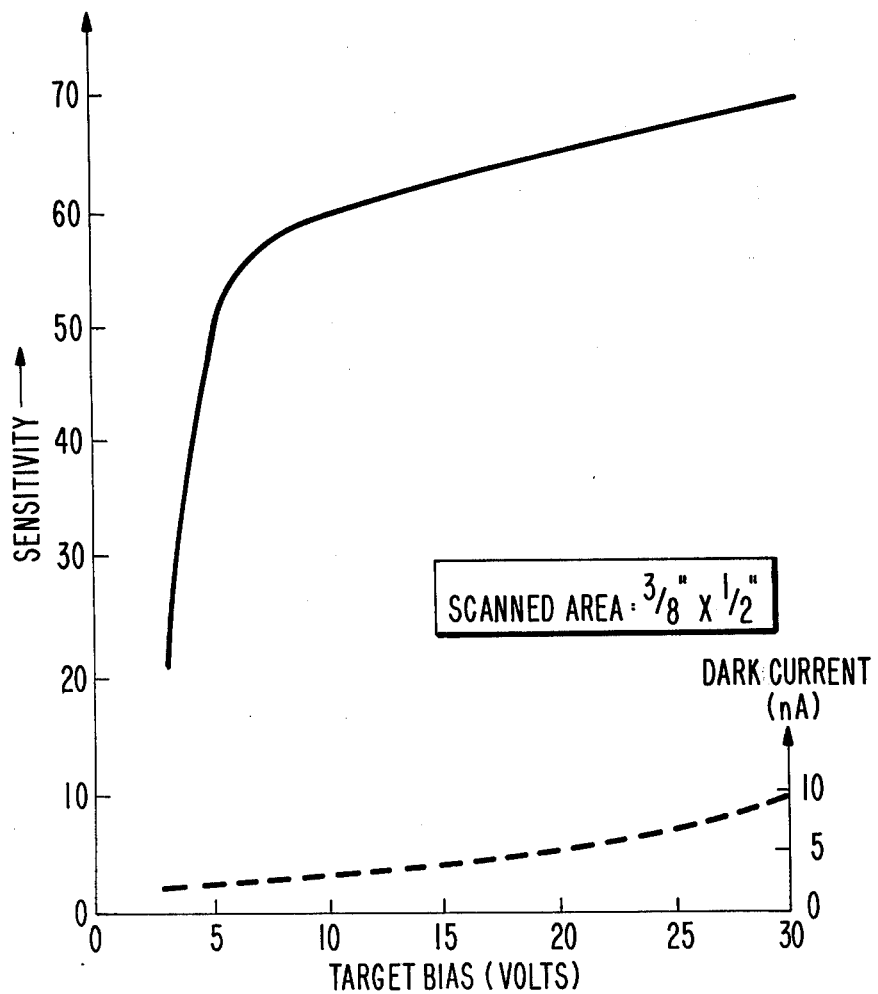
FIG. 3 is a graphical presentation of sensitivity and dark current values of a typical tube of the type depicted in FIGS. 1 and 2 in relation to various target bias or operation voltages.

Unlike prior art attempts to employ polycrystalline selenium bodies for imaging devices, the body 26 herein disclosed includes thallium doping of the selenium layer as a consequence of solid-to-solid diffusion at opposing surfaces of the selenium layer during fabrication. The thallium of the thallium or thallium containing layers applied during processing effectively diffuses within the grain boundaries of the polycrystalline selenium thereby increasing its resistivity and producing a single polycrystalline selenium layer 26 doped with thallium. This increased through-resistivity of the layer 26 together with the blocking contact formed at the interface with the coating 22, results in a high resistance photoconductive body 20 having particularly low values of dark current and other highly desirable electrical characteristics for use in imaging devices. Referring to FIG. 3, there is shown typical sensitivity and dark current values obtained for a vidicon type camera tube, including a target fabricated in accordance with the novel method herein disclosed, relative to various target bias or operating voltages.

The novel method of fabrication of the body described is relatively simple and repeatable and results in a target having a particularly desired cosmetic structure, substantially devoid of surface mottling. While the invention has been described in the preferred embodiment in relation to a method of manufacturing a target for a vidicon-type camera tube, persons of ordinary skill in the art could also employ a substantially similar method for use in the manufacture of other imaging devices such as electrophotographic plates. The method applies broadly to the manufacture of photoconductive imaging devices which include high resistance low dark current photoconductive polycrystalline selenium bodies of the type herein disclosed.

What I claim is:

1. In a method of fabricating a photoconductive imaging body having a supported layer of hexagonal selenium selenium in contact with a material at least partially containing thallium, the improvment comprising,
    baking said body at an initial temperature less than about 60° C. in an atmosphere containing air or oxygen for at least 15 minutes,
    gradually increasing the temperature to a final temperature between about 140° C. and about 180° C.; and
    baking at the final temperature for at least 15 minutes,
    whereby thallium is diffused into said selenium layer.

2. The method of claim 1, wherein said thallium or thallium containing material comprises $Tl_2Se_3$ or $Tl_2Se$.

3. The method of claim 2 wherein said material at least partially containing thallium contacts opposite major surfaces of said selenium layer.

4. The method of claim 1 wherein said temperature between said initial and final temperatures is gradually increased at a rate of about 5° C. per minute.

5. The method of claim 4, wherein said atmosphere includes water vapor.

6. The method of claim 1, including the step of anneal baking said body in an atmosphere comprising air or oxygen at a temperature of from about 80° C. to about 120° C. for a period of time necessary to decrease the dark current associated with the body by a factor of two or three.

7. The method of claim 6, wherein said atmosphere of all baking steps includes oxygen and water vapor.

* * * * *

UNITED STATES PATENT OFFICE
CERTIFICATE OF CORRECTION

PATENT NO. : 4,021,375

DATED : May 3, 1977

INVENTOR(S) : Robert Milton Moore

It is certified that error appears in the above-identified patent and that said Letters Patent are hereby corrected as shown below:

IN THE CLAIMS:

Column 4, line 40: delete --selenium--.

Column 4, line 41: change "improvment" to --improvement--.

Signed and Sealed this twenty-third Day of August 1977

[SEAL]

Attest:

RUTH C. MASON
Attesting Officer

C. MARSHALL DANN
Commissioner of Patents and Trademarks